United States Patent
Salter et al.

(10) Patent No.: US 9,831,872 B1
(45) Date of Patent: Nov. 28, 2017

(54) STATIONARY CONTROL KNOB HAVING PROXIMITY SENSORS

(71) Applicant: Ford Global Technologies, LLC, Dearborn, MI (US)

(72) Inventors: Stuart C. Salter, White Lake, MI (US); Pietro Buttolo, Dearborn Heights, MI (US); James J. Surman, Clinton Township, MI (US); James Stewart Rankin, II, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/239,242

(22) Filed: Aug. 17, 2016

(51) Int. Cl.
| | |
|---|---|
| *H03K 17/975* | (2006.01) |
| *H03K 17/96* | (2006.01) |
| *B60H 1/00* | (2006.01) |

(52) U.S. Cl.
CPC ....... *H03K 17/9622* (2013.01); *B60H 1/0065* (2013.01); *H03K 17/975* (2013.01)

(58) Field of Classification Search
CPC . B60K 2350/1024; H03K 2217/94073; H03K 17/9622; H03K 17/962; H03K 2017/9602; G06F 3/03547; G06F 2203/04808
USPC ...................................................... 200/600
See application file for complete search history.

(56) References Cited

U.S. PATENT DOCUMENTS

| | | | |
|---|---|---|---|
| 8,198,979 B2 | 6/2012 | Haag et al. | |
| 8,461,957 B2 | 6/2013 | Haag et al. | |
| 8,514,545 B2 | 8/2013 | Haag | |
| 9,197,206 B2 | 11/2015 | Salter et al. | |
| 2010/0253653 A1* | 10/2010 | Stambaugh | H03K 17/9622 345/184 |
| 2013/0207911 A1* | 8/2013 | Barton | G06F 3/0488 345/173 |
| 2016/0064167 A1* | 3/2016 | Lyszus | H03K 17/9622 200/336 |

OTHER PUBLICATIONS

"Touch Sensors Design Guide" by ATMEL, 10620 D-AT42-04/09, Revised Apr. 2009, 72 pages, Copyrighted 2008-2009 Atmel Corporation.

* cited by examiner

*Primary Examiner* — Vanessa Girardi
(74) *Attorney, Agent, or Firm* — Vichit Chea; Price Heneveld LLP

(57) ABSTRACT

A vehicle input knob assembly is provided that includes a stationary knob located in a vehicle and having an outer peripheral surface with a plurality of radial extending surfaces such as ribs and a plurality of proximity sensors located proximate to the knob to detect a user rotating a hand around the knob. The assembly also includes a controller generating a control signal based on the detected rotation of the hand. The knob may further include proximity sensors on a front surface for added user input.

18 Claims, 8 Drawing Sheets

STATIONARY CONTROL KNOB HAVING PROXIMITY SENSORS

FIELD OF THE INVENTION

The present invention generally relates to proximity sensors and related controls, and more particularly relates to a stationary control knob that utilizes proximity sensors to detect user input.

BACKGROUND OF THE INVENTION

Automotive vehicles are commonly equipped with various user actuatable switches and other controls for receiving user inputs for controlling devices onboard the vehicle. For example, rotary control knobs are often employed for intensity control such as to control audio volume or speed of a HVAC blower fan or temperature setting. The conventional mechanical rotary knobs typically rotate about an axis and thus have moving components which are susceptible to wear and breakage. It would be desirable to provide for a user input control knob that offers input control functionality without being susceptible to mechanical related wear and breakage.

SUMMARY OF THE INVENTION

According to one aspect of the present invention, a stationary input knob assembly includes a knob having an outer peripheral surface with a plurality of ribs extending therefrom. The assembly also includes a plurality of proximity sensors located proximate to the knob to detect a user rotating a hand around the knob. The assembly further includes a controller generating a control signal based on the detected rotation of the hand.

According to another aspect of the present invention, a stationary input knob assembly includes a knob having an outer peripheral surface with a non-circular shape. The assembly also includes a plurality of proximity sensors located proximate to the knob to detect a user rotating a hand around the knob. The assembly further includes a controller generating a control signal based on the detected rotation of the hand.

According to a further aspect of the present invention, a vehicle input knob assembly includes a knob located in a vehicle and having an outer peripheral surface with a plurality of radial extending surfaces. The assembly also includes a plurality of proximity sensors located proximate to the knob to detect a user rotating a hand around the knob. The assembly further includes a controller generating a control signal based on the detected rotation of the hand.

These and other aspects, objects, and features of the present invention will be understood and appreciated by those skilled in the art upon studying the following specification, claims, and appended drawings.

DETAILED DESCRIPTION OF THE PREFERRED EMBODIMENTS

Figure 1:
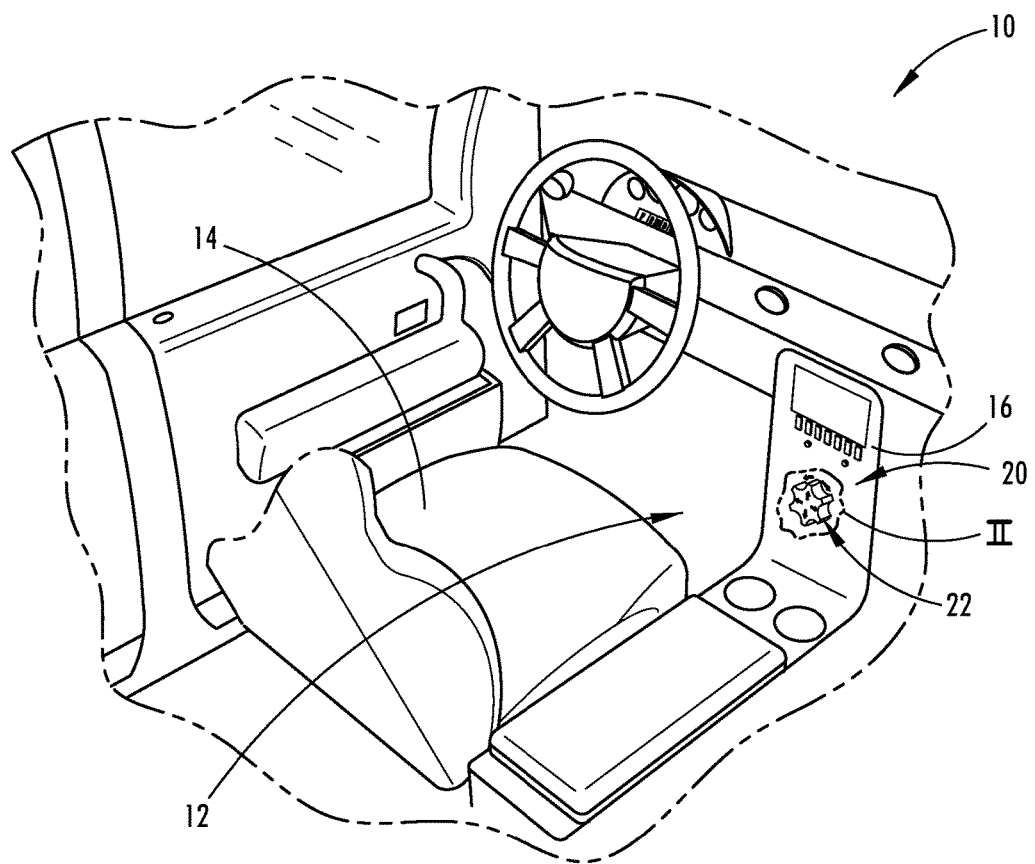
FIG. 1 is a perspective view of a passenger compartment of an automotive vehicle having a stationary control knob assembly, according to one embodiment.
Figure 2:
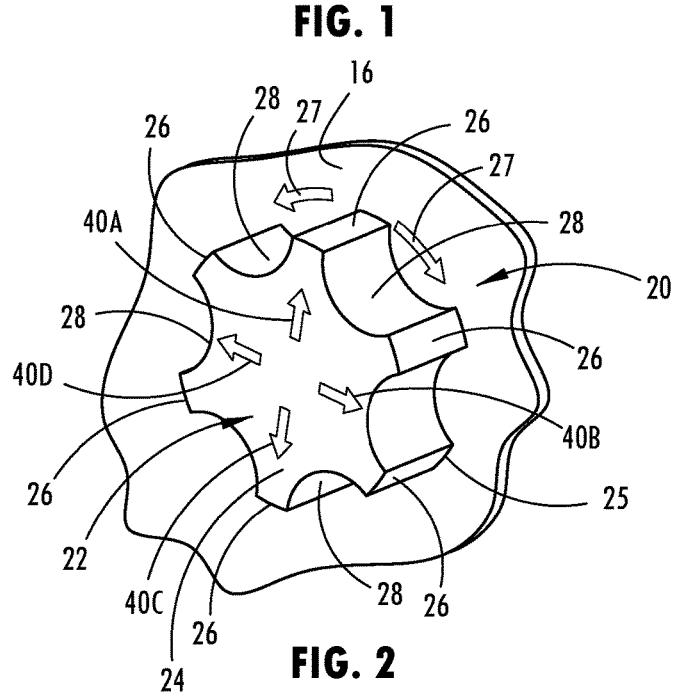
FIG. 2 is an enlarged perspective view of the stationary control knob assembly shown in FIG. 1.
Figure 3:
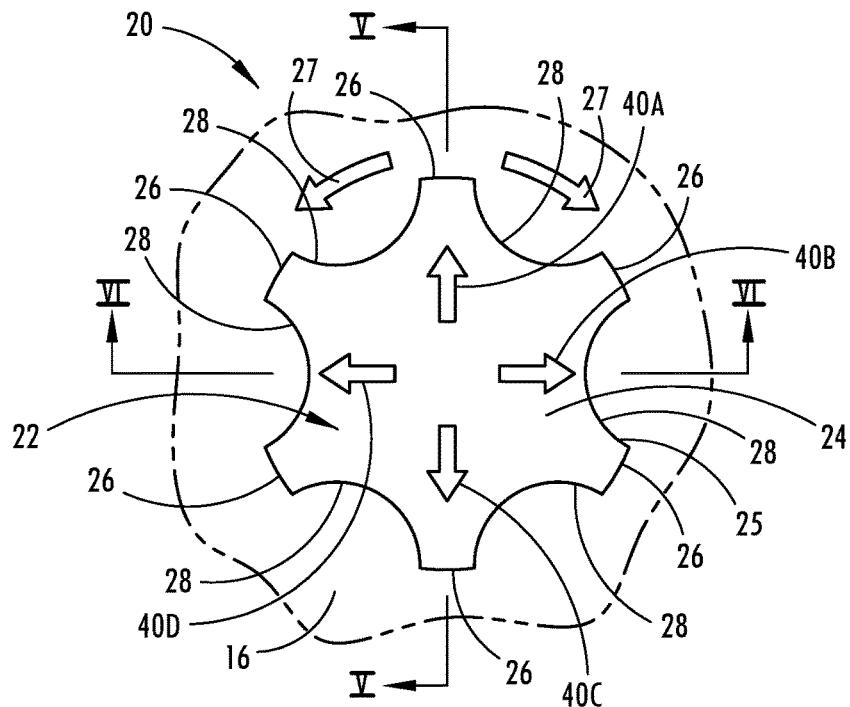
FIG. 3 is a front view of the stationary control knob assembly shown in FIG. 2.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Referring now to FIG. 1, the interior of an automotive vehicle 10, such as a wheeled motor vehicle, is generally illustrated having a passenger compartment 12 and a stationary input knob assembly 20 positioned and configured to allow a user, e.g., driver or other passenger of the vehicle, to manipulate or interact with the input knob assembly 20 to provide user input commands that may be used to control one or more devices or systems. The vehicle 10 generally includes a driver seat 14 configured to seat a passenger, such as a driver of the vehicle 10. The vehicle 10 also includes an instrument panel 16 shown generally forward of the driver seat 14. The stationary input knob assembly 20 has a stationary user engageable knob 22 located on the instrument panel 16 and shown within reach of a passenger (e.g., driver) seated in the driver seat 14. The stationary knob assembly 20 may be engaged by the hand of the user, such as the driver, which may interface therewith to input commands to control any of a number of functions for one or more devices including entertainment systems such as to control the audio volume of the radio or other audio entertainment system, the station selection of a radio station, the HVAC fan, the HVAC temperature setting, and other devices and functions that may otherwise utilize a mechanical rotational control input.

The stationary input knob assembly 20 is further illustrated in FIGS. 2-6, according to one embodiment. The stationary input knob assembly 20 is shown having the stationary knob 22 fixed to a base portion shown as the instrument panel 16 and extending forward from the base portion of the instrument panel 16. The stationary knob 22 has a front surface 24 and a forward extending sidewall 25 extending around a periphery of the knob 22. The knob 22 has a non-circular shape with a plurality of radial extending surfaces. The sidewall 25 has alternating recessed sidewall portions 28 and ribs 26 that extend around the entire 360 degrees of the sidewall 25. Each of the ribs 26 extends radially outward from the center of the knob 22 to a first surface at the periphery and the ribs 26 are separated from adjacent ribs 26 by the recessed sidewall portions 28 which provide a second surface at the periphery which is radially inward of the first surface. As such, a user may engage or grip the stationary knob 22 such that the user's hand, particularly the fingers of the hand, engage and slide around the peripheral first surface over the ribs 26 and the second surface on the recessed side wall portions 28 during clockwise or counter-clockwise rotations of the hand as indicated by arrows 27. In doing so, the stationary knob 22 remains fixed and does not rotate relative to the instrument panel 16. While the hand and its fingers rotate around the periphery first and second surfaces of the stationary knob 22, the fingers are forced by the outward extending ribs 26 to move radially outward along and over the first surface of the ribs 26 and subsequently move radially inward along the second surface when following the contour of the recessed sidewall portions 28. As such, the user's fingers move radially outward and inward as the hand and fingers rotate around the periphery of the knob 22. It should be appreciated that other configurations of the stationary knob 22 may be suitable, according to other embodiments. For example, the recessed side wall portions 28 could be otherwise configured with a different surface contour. In another example, the peripheral side wall of the knob 22 could be a generally circular shape forming the second surface with ribs protruding radially outward therefrom to form the first surface.

Figure 4:
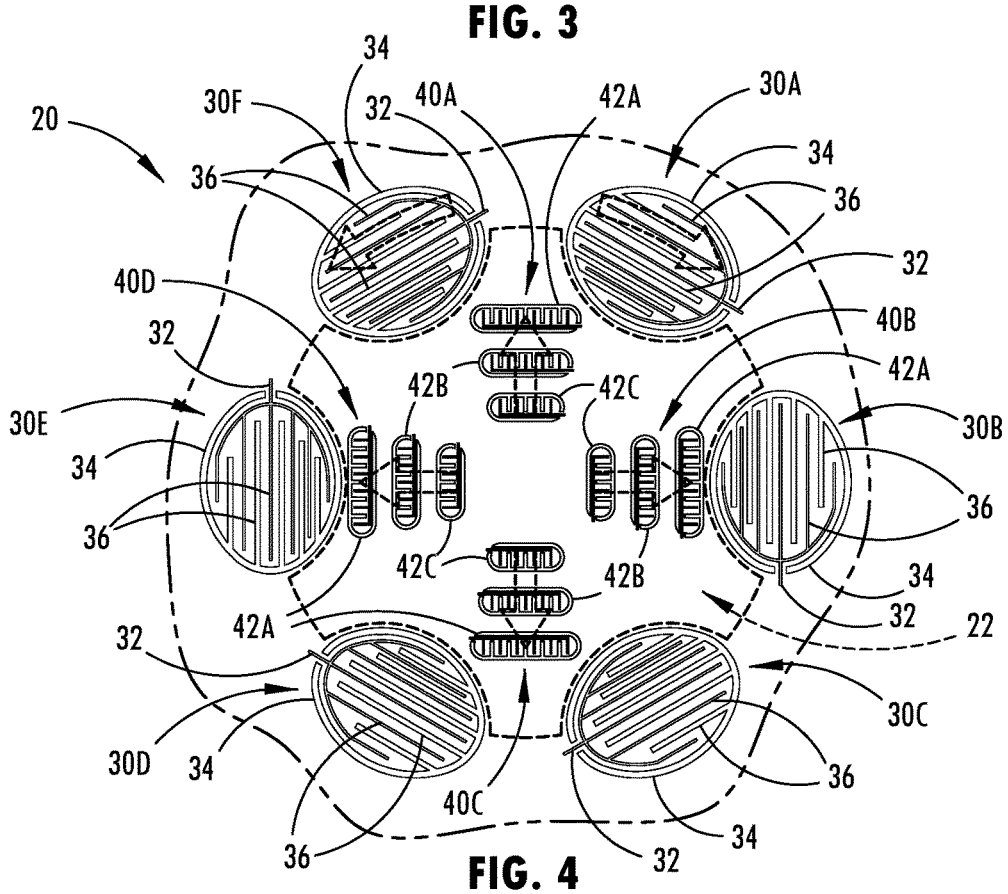
FIG. 4 is a front view of the stationary control knob assembly illustrating the proximity sensor arrangement and the knob features shown in phantom.
Figure 5:
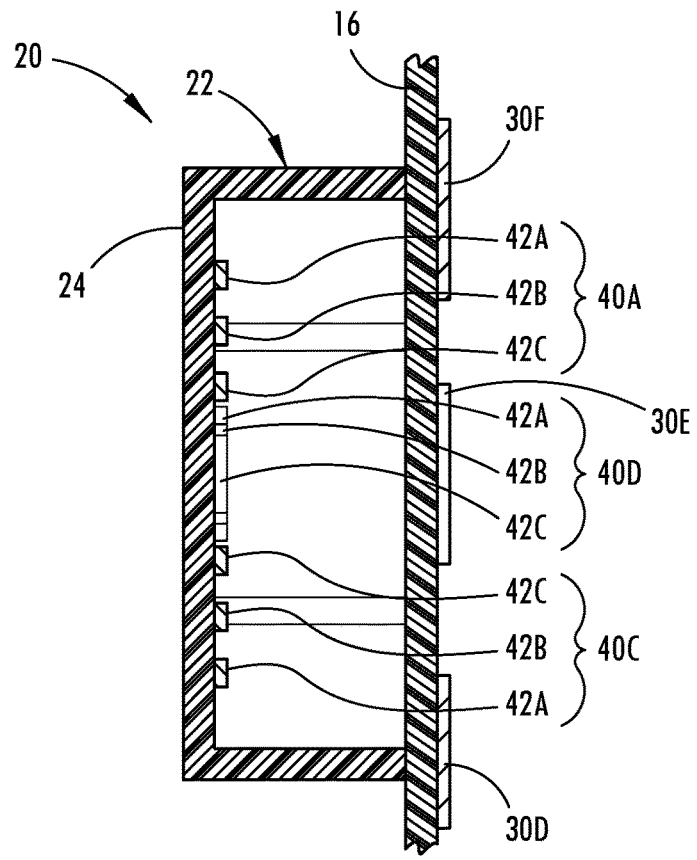
FIG. 5 is a cross-sectional view of the stationary control knob assembly taken through line V-V of FIG. 3.
Figure 6:
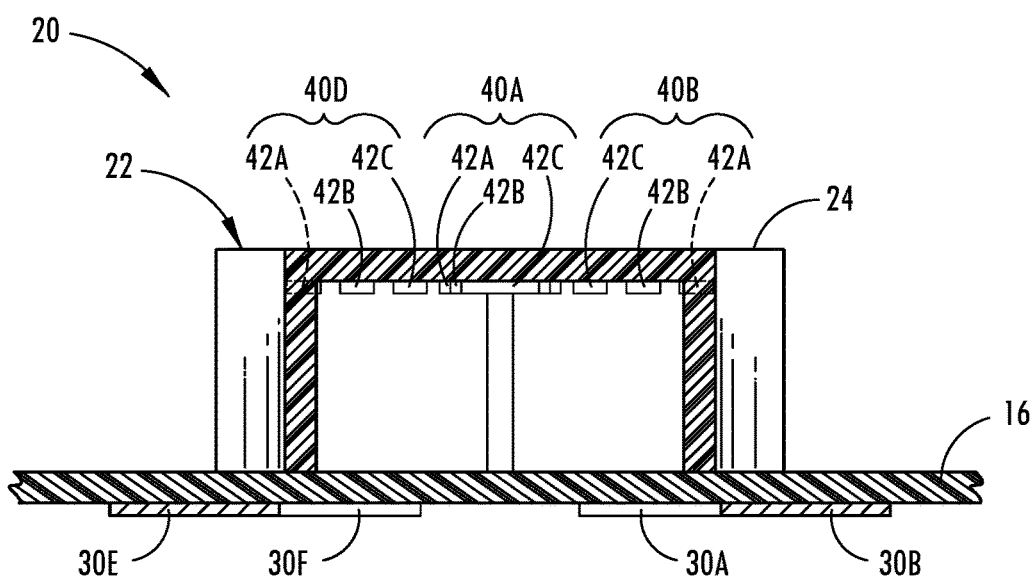
FIG. 6 is a cross-sectional view of the stationary control knob assembly taken through line VI-VI of FIG. 3.

Referring specifically to FIGS. 4-6, the stationary input knob assembly 20 is illustrated having a first plurality of proximity sensors 30A-30F located proximate to the stationary knob 22 to detect the positions of one or more fingers of a hand positioned on the knob 22 and movement of the fingers as a user rotates the hand around the knob 22. The first plurality of proximity sensors 30A-30F are shown formed on the back side of the base portion of the instrument panel 16 or other base or substrate. The first plurality of proximity sensors 30A-30F are spaced and separated from one another and located proximate the periphery of the knob 22 on a surface of the base 16 generally within the recessed sidewall portions 28 to sense a finger positioned within the recessed sidewall portions 28 between adjacent radially extending ribs 26. Each of the first plurality of proximity sensors 30A-30F are shown in one embodiment configured as capacitive sensors. Each capacitive sensor includes first and second electrodes 32 and 34. Each of the first and second electrodes 32 and 34 includes respective electrode fingers 36 and 38. The electrode fingers 36 and 38 are interdigitated relative to one another to create a sense activation field to sense contact or close proximity of a user's finger in relation to each of the proximity sensors 30A-30F. The sense activation field of each proximity sensor is a capacitive field in the exemplary embodiment and the user's finger and hand has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to inductive sensors, optical sensors, temperature sensors, resistive sensors, the like, or a combination thereof. Exemplary proximity sensors are described in the Apr. 9, 2009, ATMEL® Touch Sensors Design Guide 10620 D-AT42-A4/09, the entire reference hereby being incorporated herein by reference.

The first plurality of proximity sensors 30A-30F are shown as capacitive sensors each having a generally oval or elliptical shape and further having a pair of electrodes 32 and 34 each having a plurality of electrode fingers 36 and 38, respectively. The electrode fingers 36 of electrode 32 are spaced from and interdigitated with the electrode fingers 38 of electrode 34. Opposing adjacent electrode fingers 36 and 38 are separated by a distance based on a radial distance from the center of the knob 22. Specifically, the distance between the electrode fingers 36 and 38 increases with the radial distance from the center of the knob 22. As such, the electrode fingers 36 and 38 are spaced closer together at a location closer to the knob as compared to the larger distance between the interfacing electrode fingers 36 and 38 at a distance further radially outward from the knob 22. Thus, the electrode fingers are configured with a density that varies based on distance from the knob. This results in increased signal strength and sensitivity of the proximity sensors 30A-30F at a distance closer to the knob 22 as compared to a distance further away from the knob 22.

Figure 7:
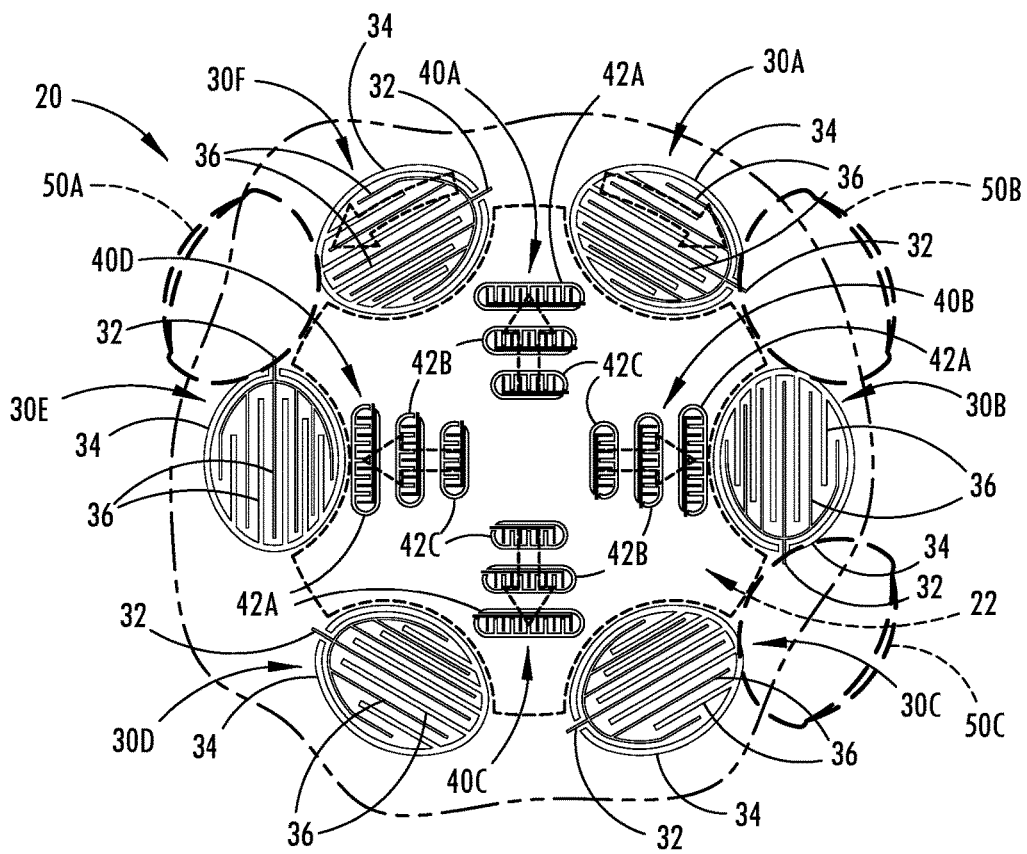
FIG. 7 is a perspective view of the stationary control knob assembly further illustrating a user's fingers interacting with the control knob.

As seen in FIG. 7, a user's three fingers 50A-50C having dielectric and electrical conductivity properties are shown each positioned on the first surface of three ribs 26 as the fingers 50A-50C engage and move along the peripheral surface of the stationary knob 22. When the user's fingers 50A-50C are located on the second surface within the recessed sidewall portion 28 directly in front of one of the proximity sensors 30A-30F, each of the user's fingers substantially covers or interacts with all of the corresponding proximity sensor and generates a relatively high amplitude signal indicative of the presence of the finger with the recessed portion due to its dielectric or electrical conductivity properties. As the fingers 50A-50C rotate clockwise around the stationary knob 22, the fingers 50A-50C move radially outward on the first surface of rib 26 and slides around the side wall and the outward protruding ribs 26 and onto the second surface of the adjacent recessed portions 28 such that each finger 50 moves to a second position generally centered on a rib 26 between the two recessed sidewall portions 28. In this position, the finger 50 is substantially removed from the activation fields generated by the proximity sensors 30A and 30B. If the fingers 50A-50C overlaps one or both of the adjacent proximity sensors, the fingers 50A-50C would generally overlap the portion of the proximity sensors having a greater separation distance between the electrode fingers, which will result in a lesser signal amplitude. As such, when the fingers 50A-50C each are located on the second surface within a recessed portion 28 between ribs 26, a large amplitude activation signal is generated, whereas when the fingers 50A-50C each are located radially outward on the outer first surface of a rib 26, the fingers generates a much smaller amplitude signal or no signal. As such, the signals generated by the first plurality of proximity sensors 30A-30F may be processed by control circuitry to determine the position of the user's fingers on the stationary knob 22 and the direction and velocity of travel of the fingers as a person's hand and fingers are rotated clockwise or counter-clockwise around the sidewall surfaces of the stationary knob 22.

Figure 8:
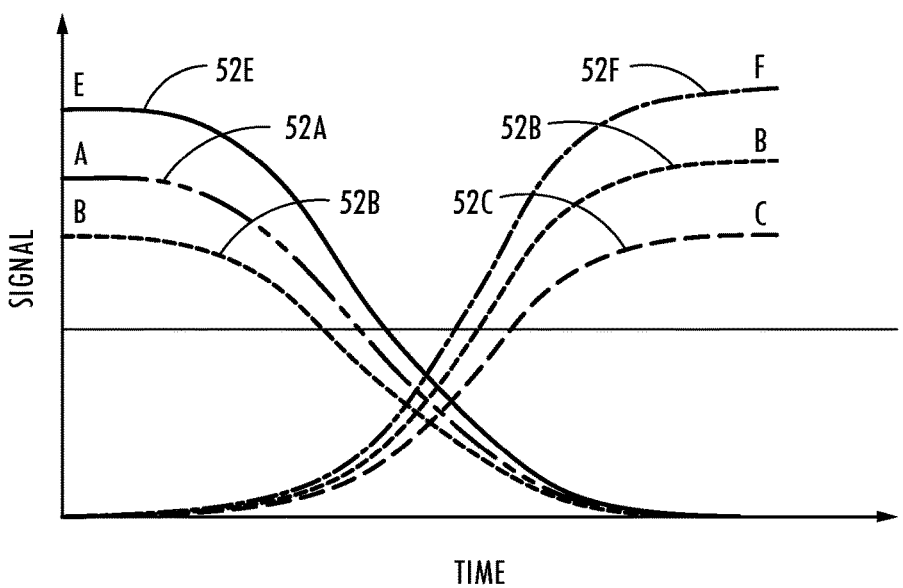
FIG. 8 is a graph illustrating the proximity sensor signals responsive to clockwise movement of the fingers illustrated in FIG. 7.

Referring to FIG. 8, signals generated by the first plurality of proximity sensors are generally illustrated as the hand and three fingers 50A-50C on the hand of a user as shown in FIG. 7 are rotated in a clockwise direction around the outer sidewall surfaces of the stationary knob 22. In this example, signal 52E is a signal generated by proximity sensor 30E, signal 52A is a signal generated by proximity sensor 30A and the signal 52B is a signal generated by proximity sensor 30B. In addition, signal 52F is the signal generated by proximity sensor 30F, and signal 52C is the signal generated by proximity sensor 30C. Signals 52E, 52A and 52B are shown at a high amplitude signal when the user's fingers are located on the second surface within a recessed sidewall directly in front of the respective proximity sensors 30E, 30A and 30B. As the fingers 50A-50C rotate clockwise, the fingers move radially outward on the first surface over rib 26 so as to transition away from the prior engaged proximity sensor to a position between proximity sensors in which the signal drops substantially to zero. The three fingers 50A-50C of the hand at the same time that were located proximate to a rib 26 rotate into a position within a recessed side wall portion 28 and are detected by the corresponding proximity sensors such that signals 52F, 52B and 52C rise up as shown. The signals generated by the proximity sensors 30A-30F may then be processed by a controller or other control circuitry to determine the position of the fingers 50A-50C and the amount and rate of rotation and direction of the fingers 50A-50C as the hand rotates around the outer surfaces of the stationary knob 22. The determined position and velocity of rotation of the knob 22 may be used to determine the intended user input and in turn may generate a command output signal.

Referring back to FIGS. 2-4, the stationary input knob assembly 20 is further illustrated having a second plurality of proximity sensors 40A-40D located proximate to the front surface 24 of the stationary knob 22 which forms a touchpad. The second plurality of proximity sensors 40A-40D are shown each forming linear sensors for detecting the presence of a user's finger in close proximity thereto such as a touch and a sliding movement of the finger in a linear direction, such as a horizontal or vertical direction indicated by the arrows shown. Each of the second plurality of proximity sensors are shown in FIG. 4 having a linear array of three proximity sensors 42A-42C. The linear array of proximity sensors are shown configured as capacitive sensors having electrodes and electrode fingers that are interdigitated with opposing electrode fingers, similar to those configured in the first plurality of proximity sensors, except the fingers are spaced and sized evenly and the length of the sensors may vary. Capacitive sensor 42A has a longer length than capacitive sensor 42B which has a longer length than capacitive sensor 42C, such that variations in signal strength may be detected based on the position of a user's finger relative to each of the capacitive sensors 42A-42C. The second plurality of proximity sensors 40A-40D enables further input of the stationary input knob assembly 20 by allowing a user to make additional inputs such as menu selections. For example, a user may select a menu selection by interacting with one or more of the second plurality of proximity sensors 48A-48D and then may further provide a rotational movement about the stationary knob 22 sensed by the first plurality of proximity sensors 30A-30F to make a further user input selection for a particular selected menu item. For example, a user may select audio volume from a menu with one or more of the second plurality of proximity sensors 40A-480D and then subsequently may adjust the amplitude of the volume with the first plurality of proximity sensors 30A-30F.

Figure 9:
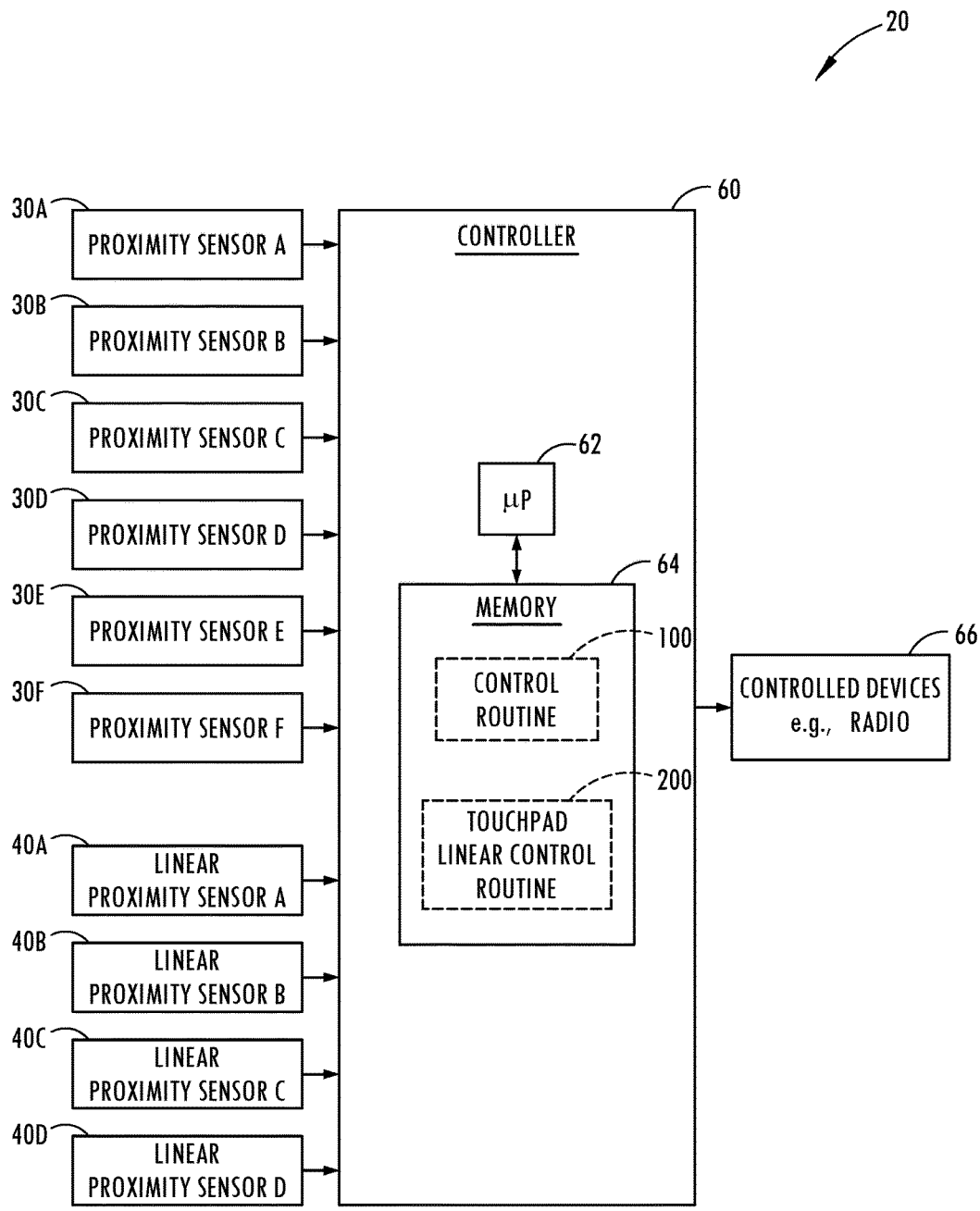
FIG. 9 is a block diagram illustrating the stationary control knob assembly and devices controlled therewith, according to one embodiment.

Referring to FIG. 9, the stationary input knob assembly 20 is illustrated having a controller 60 generally including a microprocessor 62 and memory 64. It should be appreciated that the controller 60 may be a digital dedicated controller or a shared controller (e.g. body controller or entertainment system controller) or may include other analog and/or digital control circuitry. The controller 60 receives the various sensor inputs including each of the first plurality of proximity sensors 30A-30F and each of the sensor inputs from the second plurality of proximity sensors 40A-40D. The controller 60 processes the sensor generated inputs and determines the position and movement of the user's fingers interfacing with the knob based on the sensed signals. This may be achieved by processing a rotary control routine 100 and a touchpad linear control routine 200 stored within memory 64 and executed by the microprocessor 62. The rotary control routine 100 determines the rotary position and movement of the fingers on the sidewall during a rotational input, whereas the touchpad linear control routine 200 determines the position and linear movement of a finger on the front wall touchpad. The controller 60 may then further determine one or more output signals which would be used to control a device 66 such as a radio or other device.

Figure 10A:
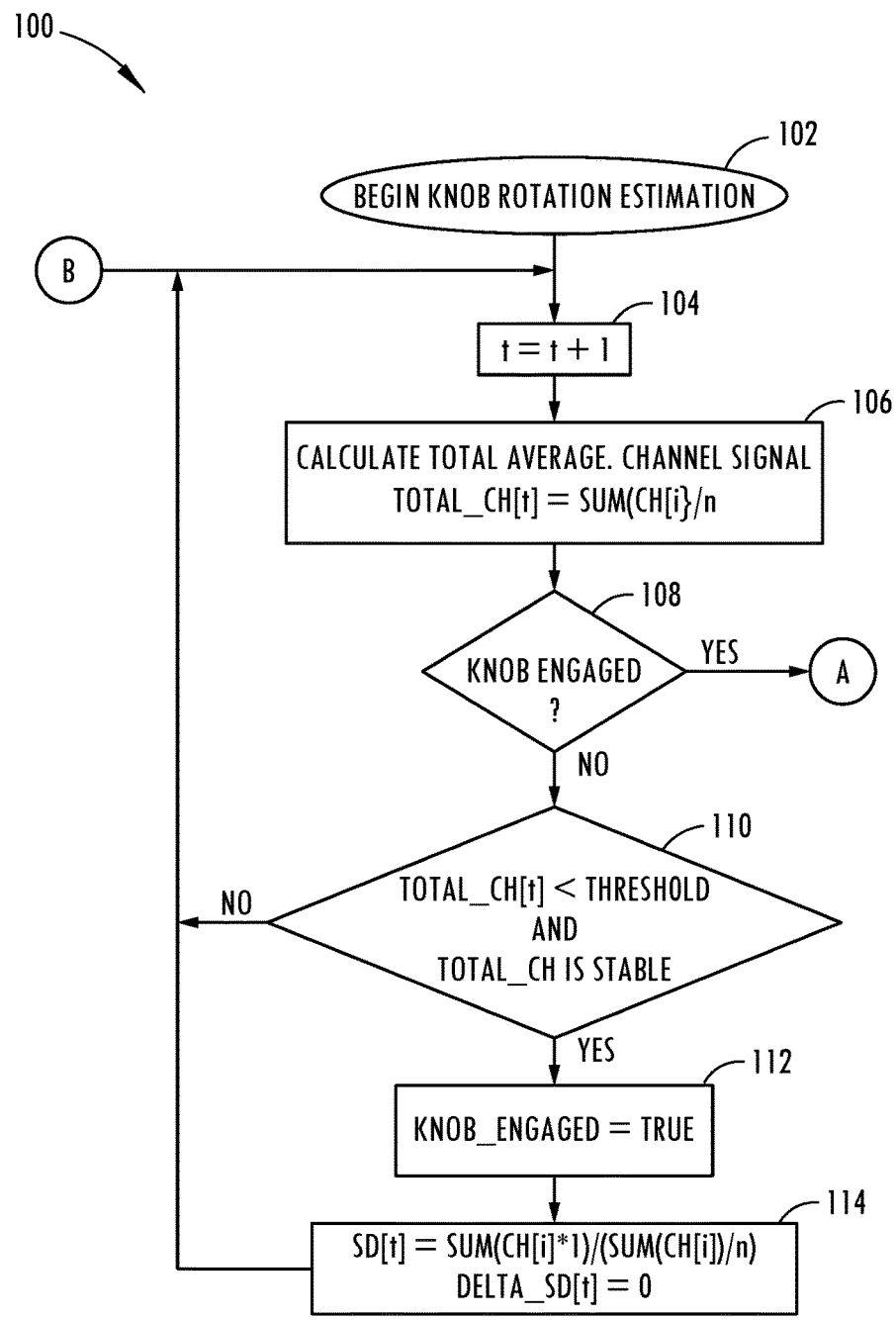
FIGS. 10A-10B is a flow diagram illustrating a rotary control routine for processing the proximity sensor signals and generating control output signals, according to one embodiment.
Figure 10B:
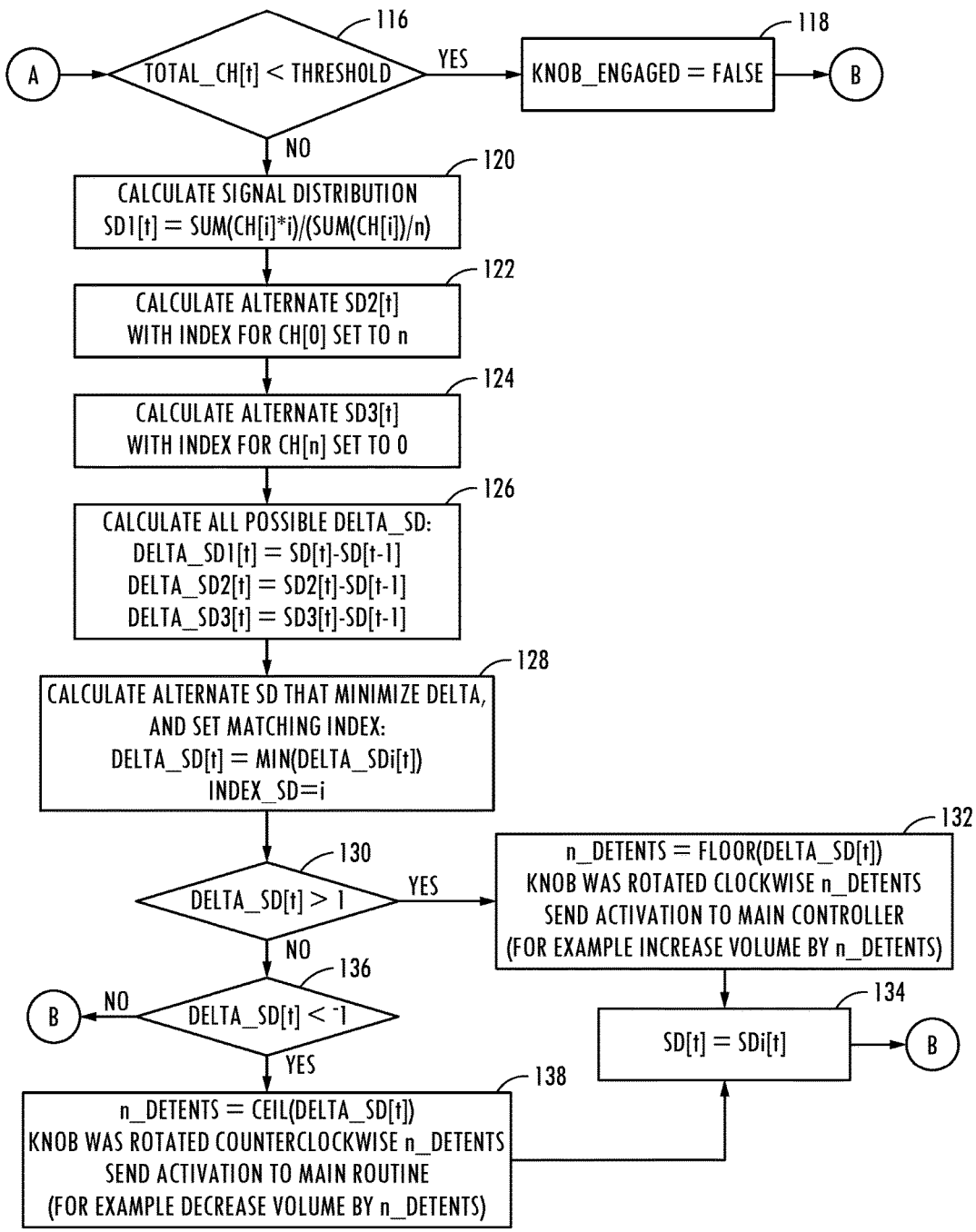

The rotary control routine 100 is illustrated in FIGS. 10A-10B, according to one embodiment. Control routine 100 begins the knob rotation estimation at step 102 and proceeds to step 104 to increment a time increment [t] by a value of one. Next, at decision step 106, routine 100 calculates the total average channel signal CH[t]. At 108, routine 100 determines is the knob is engaged by a user and, if not, proceeds to decision step 110 to determine if the total average channel signal CH[t] is greater than a threshold and is stable. If the total average channel signal is not greater than the threshold and stable, routine 100 returns to step 104. Otherwise, with the total average channel signal being greater than the threshold and stable, routine 100 proceeds to step 112 to set the knob engaged flag to true and then to step 114 to determine the signal distribution (SD[t]) which is calculated as a function of the average of channel indexes weighed by each channel signal. SD represents the average finger position weighed by the signal intensity, DELTA_SD[t] represents the incremental change in average finger position and it is initially set to zero. SD and DELTA_SD are used to determine the incremental rotation of the knob as a function of the position of the user's fingers on the knob.

If the knob is determined at step 108 to be engaged by the hand of a user, control routine 100 proceeds to decision step 116 to determine if the total average channel signal is less than the threshold and, if so, proceeds to step 118 to set the knob enabled flag to false, before returning to step 104. If the total average channel signal CH[t] is determined to be greater than or equal to the threshold, then routine 100 proceeds to step 120 to calculate a first signal distribution SD1[*t*] as a function of the average of channel indexes weighed by each channel signal. Next, routine 100 calculates an alternate second signal distribution SD2[*t*] with the index for channel CH[0] set to n, where n is the number of detents or incremental input changes. Routine 100 the proceeds to step 124 to calculate an alternate third signal distribution SD3[*t*] with the index for channel ch[n] set to zero. Routine 100 then calculates all possible DELTA_SD changes for each incremental difference in value. Next, routine 100 calculates the alternate SD that minimizes DELTA, and sets the matching index for DELTA_SD[t] to the minimum.

Proceeding to decision step 130, routine 100 determines is the signal distribution SD[t] is greater than 1 and, if so, proceeds to step 132 to set n detents equal to the floor (DELTA_SD[t]), in which the knob was rotated clockwise n detents and sends an activation signal to the main controller, such as, for example, to increase volume by n detents. Thereafter, routine 100 then sets the signal distribution SD[t] to the initial default setting at step 134 before returning to step 104. If DELTA_SD[t] is not greater than 1 at step 130, then routine 100 proceeds to decision step 136 to determine is DELTA_SD[t] is less than −1 and, if so, proceeds to step 138 to set n detents to ceil(DELTA_SD[t]), in which the knob was rotated counterclockwise n detents and sends an activation signal to the main routine such as, for example, to decrease the volume by n detents and sets SD[t] to the initial value at step 134 before returning to step 104. If DELTA_SD [t] is not less than −1, routine 100 returns to step 104.

Figure 11:
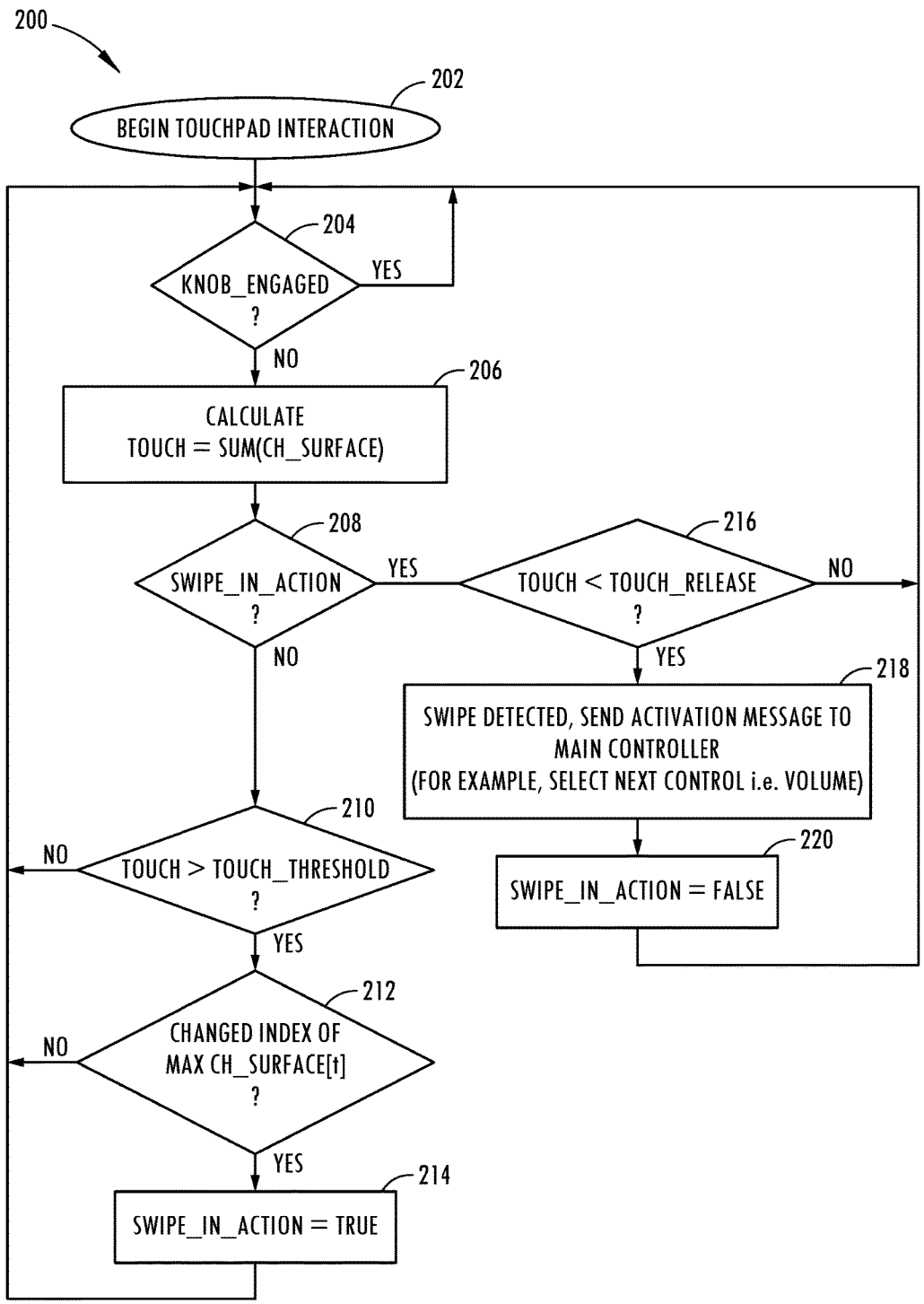
FIG. 11 is a flow diagram illustrating a linear control routine for processing the proximity sensor signals on the front touchpad and generating control output signals, according to one embodiment.

The touchpad linear control routine 200 is illustrated in FIG. 11 beginning the touchpad interaction at step 202. Routine 200 proceeds to decision step 204 to determine if the knob is engaged and, if so, returns to the beginning. If the knob is not engaged, routine 200 proceeds to step 206 to calculate a touch value on the touchpad as a sum of the signal channel surface. Next, at decision 208, routine 200 determines is there is a user touch swipe motion in action. If there is no touch swipe motion, routine 200 proceeds to decision step 210 to determine is the touch signal is greater than a touch threshold and, if not, returns to step 204. If the touch signal exceeds the touch threshold, then routine 200 proceeds to decision step 212 to determine if there is a changed index of the Max ch_surface[t] and, if not, returns to step 204. If there is a changed index of the max ch_surface [t], then routine 200 proceeds to step 214 to set the swipe_in_action flag to true, before returning.

If a swipe in action motion was detected at step 208, routine 200 proceeds to step 216 to determine if the touch signal is less than a touch_release value and, if not, returns to step 204. If the touch signal is less than the touch release value, then routine 200 proceeds to step 218 to determine that a swipe is detected and sends an activation message to the main controller, such as, for example, to select the next control mode, e.g., volume control mode. Next, at step 220, routine sets the swipe_in_action flag to false, before returning to step 204.

The stationary input knob assembly 20 advantageously provides for a fixed knob that allows a user to input one or more commands to control a vehicle function. The knob 22 is fixed such that it does not rotate or otherwise move with movable mechanical components, and thus is less susceptible to wear and tear and any resulting damage. In addition, the linear proximity sensors allow mode selections to select the mode of operation used with the rotary knob control.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A vehicle input knob assembly comprising:
a knob located in a vehicle and having an outer peripheral surface with a plurality of radial extending surfaces and recesses between the radial extending surfaces;
a plurality of proximity sensors located proximate to the knob where the radial extending surfaces and recesses serve to position a portion of a user's hand during movement around the knob; and
a controller generating a control signal based on the detected movement of the hand.

2. The assembly of claim 1, wherein the knob has a front surface further comprising one or more additional proximity sensors for providing one or more control function inputs.

3. The assembly of claim 1, wherein the proximity sensors comprise a plurality of capacitive sensors.

4. The assembly of claim 3, wherein each of the capacitive sensors comprises first and second electrodes each having electrode fingers, wherein the electrode fingers have a density that varies based on distance from the knob.

5. A stationary input knob assembly comprising:
a knob having an outer peripheral surface with a plurality of ribs extending therefrom;
a plurality of proximity sensors located proximate to recesses between adjacent ribs on the knob; where the ribs and recesses serve to position a portion of a user's hand during movement around the knob; and
a controller generating a control signal based on the detected movement of the hand.

6. The assembly of claim 5, wherein the assembly is located on a vehicle for use by a passenger in the vehicle.

7. The assembly of claim 5, wherein the knob has a front surface further comprising one or more additional proximity sensors for providing one or more control function inputs.

8. The assembly of claim 5, wherein the knob extends from a base, wherein the plurality of proximity sensors are formed proximate to the base.

9. The assembly of claim 8, wherein the proximity sensors are located on a surface of the base.

10. The assembly of claim 5, wherein the proximity sensors comprise a plurality of capacitive sensors.

11. The assembly of claim 10, wherein each of the capacitive sensors comprises first and second electrodes each having electrode fingers, wherein the electrode fingers have a density that varies based on distance from the knob.

12. The assembly of claim 11, wherein the density decreases based on distance from the knob.

13. A stationary input knob assembly comprising:
a stationary knob having an outer peripheral surface with a non-circular shape;
a plurality of capacitive sensors located proximate to the knob to detect a user moving a hand around the knob, each sensor comprising first and second electrodes each comprising electrode fingers having a density that varies based on distance from a center of the knob; and
a controller generating a control signal based on the detected movement of the hand.

14. The assembly of claim 13, wherein the density decreases based on distance from the center of the knob.

15. The assembly of claim 13, wherein the assembly is located on a vehicle for use by a passenger in the vehicle.

16. The assembly of claim 13, wherein the knob has a front surface further comprising one or more additional proximity sensors for providing one or more control function inputs.

17. The assembly of claim 13, wherein the knob extends from a base, wherein the plurality of proximity sensors are formed proximate to the base.

18. The assembly of claim 17, wherein the proximity sensors are located on a surface of the base.

* * * * *